United States Patent
Endo et al.

(10) Patent No.: US 9,077,197 B2
(45) Date of Patent: Jul. 7, 2015

(54) BATTERY RESIDUAL AMOUNT MEASUREMENT SYSTEM, COMPUTER-READABLE MEDIUM STORING BATTERY RESIDUAL AMOUNT MEASUREMENT PROGRAM, AND BATTERY RESIDUAL AMOUNT MEASUREMENT METHOD

(71) Applicant: LAPIS SEMICONDUCTOR CO., LTD., Tokyo (JP)

(72) Inventors: Hitoshi Endo, Tokyo (JP); Kentaro Kotota, Tokyo (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 255 days.

(21) Appl. No.: 13/731,131

(22) Filed: Dec. 31, 2012

(65) Prior Publication Data

US 2013/0175994 A1   Jul. 11, 2013

(30) Foreign Application Priority Data

Jan. 11, 2012 (JP) ................................. 2012-003568

(51) Int. Cl.
  *H02J 7/00* (2006.01)
  *G01R 31/36* (2006.01)
  *H01M 10/48* (2006.01)
(52) U.S. Cl.
  CPC .......... *H02J 7/0063* (2013.01); *G01R 31/3624* (2013.01); *G01R 31/3651* (2013.01); *H01M 10/48* (2013.01); *H01M 10/486* (2013.01)

(58) Field of Classification Search
  CPC .......... G01R 31/3624; G01R 31/3651; H01M 10/48; H01M 10/486; H02J 7/0063
  See application file for complete search history.

(56) References Cited

U.S. PATENT DOCUMENTS 6,057,677 A * 5/2000 Wakana et al. ................. 324/96
2011/0241693 A1* 10/2011 Kurata .......................... 324/427

FOREIGN PATENT DOCUMENTS

JP   10144358 A    5/1998
JP   2007327971 A  12/2007

* cited by examiner

*Primary Examiner* — Vuthe Siek
(74) *Attorney, Agent, or Firm* — Volentine & Whitt, PLLC

(57) ABSTRACT

A battery residual amount measurement system including includes a current detection section that detects a current value of current discharged from a battery that is an object of measurement; a first storage section that stores reference undischargeable amounts that are determined in advance in accordance with ambient temperatures of the battery and current values of current discharged from the battery; and a calculating section that, when a discharging operation is carried out at the battery, acquires, from the first storage section, the reference undischargeable amount that corresponds to an ambient temperature of the battery and the current value detected by the current detection section, and calculates a battery residual amount on the basis of a undischargeable amount that is calculated and computed on the basis of the acquired reference undischargeable amount and a nominal battery capacity of the battery.

12 Claims, 12 Drawing Sheets

BATTERY RESIDUAL AMOUNT MEASUREMENT SYSTEM, COMPUTER-READABLE MEDIUM STORING BATTERY RESIDUAL AMOUNT MEASUREMENT PROGRAM, AND BATTERY RESIDUAL AMOUNT MEASUREMENT METHOD

CROSS-REFERENCE TO RELATED APPLICATION

This application claims priority under 35 USC 119 from Japanese Patent Application No. 2012-003568, filed on Jan. 11, 2012, the disclosure of which is incorporated by reference herein.

BACKGROUND OF THE INVENTION

1. Field of the Invention

The present invention relates to a battery residual amount measurement system, a computer-readable medium storing a battery residual amount measurement program, and a battery residual amount measurement method.

2. Description of the Related Art

The relative charged level of a battery that is called the state of charge (SOC) is defined as the ratio of the residual amount of charge (the battery residual amount) with respect to the charge capacity (e.g., the nominal battery capacity) of the battery. Here, measurement and monitoring of the flow of charges must be carried oat by using a method called "coulomb counting". Actual coulomb counting processing is realized by integrating the currents that flow into the battery and the currents that flow out of the battery. Generally, a small resistor is connected in aeries to the negative electrode of the battery, and these currents are measured by using a high-resolution ADC (analog/digital converter).

Japanese Patent Application Laid-Open (JP-A) No. 2007-327971 discloses a technique relating to a battery residual amount measurement system that measures the residual amount of a battery. A method of computing the battery residual amount that accompanies charging and discharging, while taking into consideration even the undischargeable amount (the amount of electricity that is deemed unable to be discharged), and a technique of storing a undischargeable amount characteristic, that corresponds to a characteristic of the battery, in a memory are disclosed in JP-A No. 2007-327971.

The present inventors studied how to reduce system preparation costs by avoiding the need to separately manufacture battery residual amount measurement systems (the need to manufacture systems separately in accordance with characteristics), by making it possible to measure the battery residual amounts of batteries having different characteristics (e.g., charge capacities, nominal battery capacities) by a same battery residual amount measurement system.

The present inventors studied how to realize this idea in a conventional battery residual amount measurement system. However, the technique (the battery residual, amount measurement device) disclosed in JP-A No. 2007-327971, for example, is premised on the undischargeable amount characteristic of a battery being stored in advance in a memory. Therefore, even if an attempt is made to measure the battery residual amounts of batteries, that have different characteristics, by using the same battery residual amount measurement system, the undischargeable amount characteristic differs in accordance with the type of battery, and therefore, the battery residual amount may not be measured accurately in a case in which the system is used for a battery of a different characteristic instead.

SUMMARY OF THE INVENTION

The present invention provides a battery residual amount measurement system, a computer-readable medium storing a battery residual amount measurement program, and a battery residual amount measurement method that may accurately measure battery residual amounts of batteries having different characteristics.

A first aspect of the present invention is a battery residual amount measurement system including: a current detection section that detects a current value of current discharged, from a battery that is an object of measurement; a first storage section that stores reference undischargeable amounts that are determined in advance in accordance with ambient temperatures of the battery and current values of current discharged from the battery; and a calculating section that, when a discharging operation is carried out at the battery, acquires, from the first storage section, the reference undischargeable amount that corresponds to an ambient temperature of the battery and the current value detected by the current detection section, and calculates a battery residual amount on the basis of a undischargeable amount that is calculated and computed on the basis of the acquired reference undischargeable amount and a nominal battery capacity of the battery.

A second aspect of the present invention is a computer readable medium storing a battery residual amount measurement program for causing a computer to function as the calculating section of the battery residual amount measurement system of the first aspect of the present invention.

A third aspect of the present invention is a battery residual amount measurement method including: in a state in which reference undischargeable amounts, that have been determined in advance in accordance with ambient temperatures of a battery and current values of current discharged from the battery, are stored in a first storage section, detecting, by a current detection section, a current value of current discharged from a battery that is an object of measurement; and when a discharging operation is carried out at the battery, acquiring, by a calculating section, the reference undischargeable amount that corresponds to an ambient temperature of the battery and the current value detected by the current detection section item the first storage section, and calculating, by the calculating section, a battery residual amount on the basis of a undischargeable amount that is calculated and computed on the basis of the acquired reference undischargeable amount and a nominal battery capacity of the battery.

In accordance with the present invention, there may be provided a battery residual amount measurement system, a computer-readable medium storing a battery residual amount measurement program, and a battery residual amount measurement method that may accurately measure battery residual amounts of batteries having different characteristics.

BRIEF DESCRIPTION OF THE DRAWINGS

Exemplary embodiments of the present invention will be described in detail based on the following figures, wherein.

DETAILED DESCRIPTION OF THE INVENTION

A battery residual amount measurement system of the present exemplary embodiment is described hereinafter with reference to the drawings.

Figure 1:
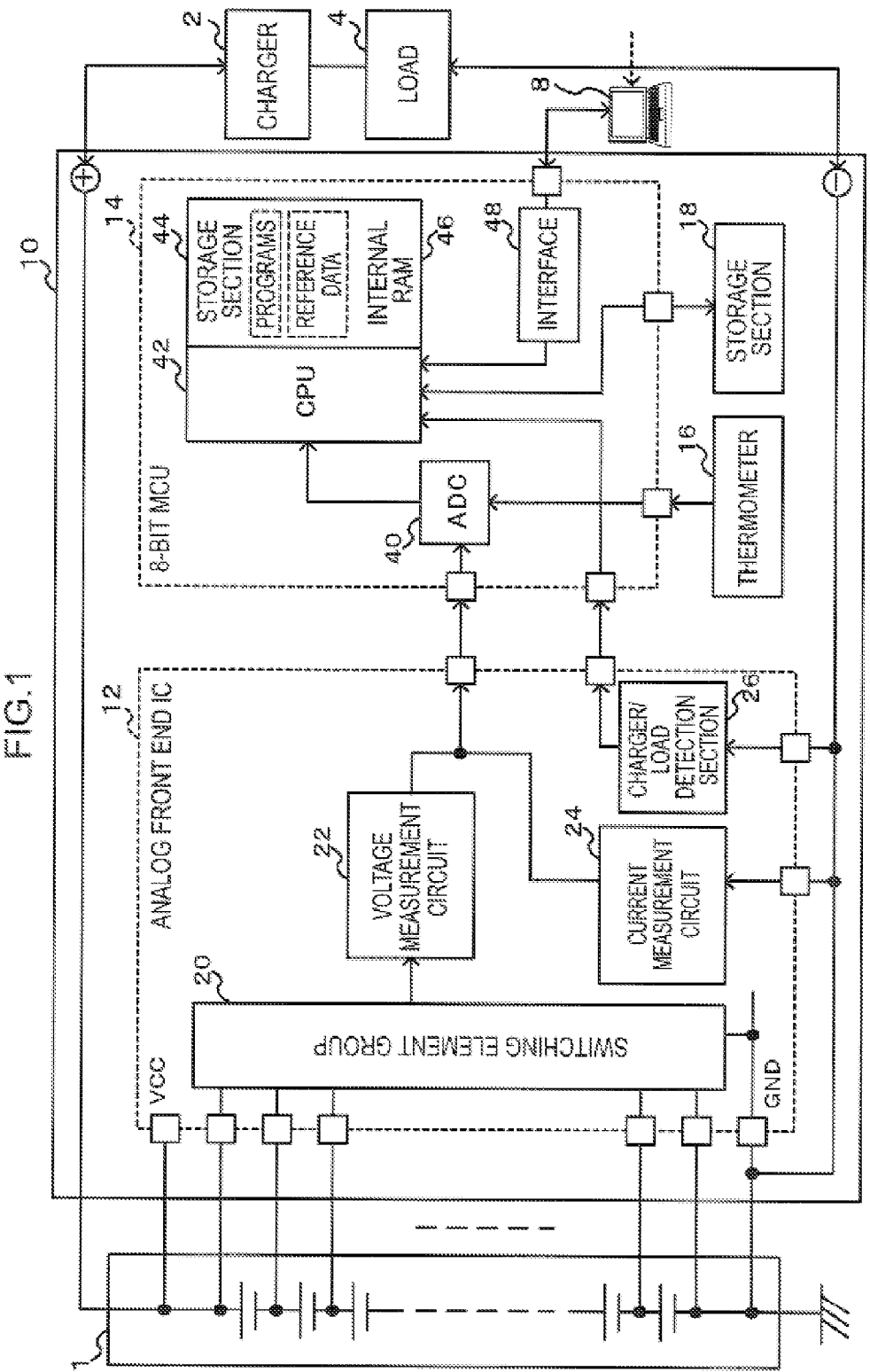
FIG. 1 is a schematic structural drawing showing a battery residual amount measurement system of a present exemplary embodiment.

First, the schematic structure of the overall battery residual amount measurement system of the present exemplary embodiment is described. An example of the schematic structure of the battery residual amount measurement system of the present exemplary embodiment is shown in FIG. 1. Note that, in the present exemplary embodiment, as an example, description is given of a battery residual amount measurement system 10 that measures the battery residual amount of battery cell group 1 in which plural lithium ion batteries, that serve as secondary batteries, are connected in series.

As shown in FIG. 1, at the battery cell group 1, plural battery cells (lithium ion batteries) are connected in series, and the battery cell group 1 is structured such that voltage of the highest potential side is supplied as power source voltage VCC to the battery residual amount measurement system 10 (an analog front end IC 12). Further, the battery cell group 1 is structured such that voltage of the lowest potential side is supplied as GND voltage of the battery residual amount measurement system 10.

The battery residual amount measurement system 10 of the present exemplary embodiment has the analog front end IC 12, an 8-bit MCU 14, a thermometer 16, and a storage section 18.

The analog front end IC 12 has the function of detecting the battery voltage of the battery cell group 1, and the like, and has a switching element group 20, a voltage measurement circuit 22, a current measurement circuit 24, and a charger/load detection section 26. The switching element group 20 has plural switching elements that correspond to the respective battery cells of the battery cell group 1. Due to the ON/OFF states of the switching elements being controlled, a battery cell is selected from the battery cell group 1, and the voltages of the battery cells, are made to be equal. The voltage value of the highest potential side of the battery cell selected by the switching element group 20, and the voltage value of the lowest potential side, are outputted to the voltage measurement circuit 22. On the basis of the outputted voltage values, the voltage measurement circuit 22 measures and outputs the voltage of the battery cell selected, at the switching element group 20.

Note that, in the battery cell residual amount measurement system 10 of the present Exemplary embodiment, control is carried out so as to make the voltages of the respective battery cells equal, on the basis of the battery cell voltages of the battery cell group 1 measured at the voltage measurement circuit 22. For example, in a case in which a battery cell voltage is high (a case in which a battery cell voltage is higher than a predetermined value or the average value of all of the battery cell voltages), the high potential, side and the low potential side of that battery cell are short-circuited and are discharged by an unillustrated discharge circuit, and due thereto, the battery voltages of the respective battery cells are made to be equal. Because control is carried out such that the respective battery cell voltages become equal in this way, the battery residual amount (the residual amount of the battery capacity) can be set in an equal (the same) state at the respective battery cells in the present exemplary embodiment.

The current measurement circuit 24 is connected to the lowest potential side of the battery cell group 1, and measures the current for the entire battery cell group 1. Note that, in the present exemplary embodiment the current measurement circuit 24 is connected to the lowest potential side of the battery cell group 1, but the present invention is not limited thereto, and it suffices for the current measurement circuit 24 to be connected to a position at which it can measure the current for the entire battery cell group 1. For example, the current measurement circuit 24 may be connected to the highest potential side of the battery cell group 1, or may be connected to another place. The voltage value measured by the voltage measurement circuit 22 and the current value measured by the current measurement circuit 24 are outputted to the 8-bit MCU 14. In the present exemplary embodiment, the current measurement circuit 24 measures the current for the entire battery cell group 1 in this way. However, in the battery residual amount measurement system 10 of the present exemplary embodiment, the battery voltages of the respective battery cells of the battery cell group 1 are made to be equal as described above, and therefore, there is no need to individually measure the voltage per battery cell.

Further, the charger/load detection section 26 is connected to the lowest potential side of the battery cell group 1. The charger/load detection section 26 detects whether or not a charger 2 or load 4 is connected to or disconnected from the battery cell group 1, and notifies the 8-bit MCU 14 of these results of detection.

In the present exemplary embodiment, the analog front end IC 12 and the 8-bit MCU 14 are connected by, as a concrete example, an I2C (Inter-Integrated Circuit) interface (not illustrated). Note that the present invention is not limited thereto, and the analog front end IC 12 and the 8-bit MCU 14 may be connected by using a synchronous serial interface (SPI). Further, a parallel interface may be used. Note that, by using an SPI, there is the effect that it is more difficult to be affected by noise when the battery cell residual amount measurement system 10 is used as an in-vehicle system.

The 8-bit MCU 14 corresponds to an example of the calculating section of the present invention, and has the function of computing die battery residual amount of the battery cells of the battery cell group 1. Note that, in the present exemplary embodiment, as a concrete example, the 8-bit MCU 14 is structured by an 8-bit microcomputer, but the present invention is not limited thereto. The 8-bit MCU 14 has an ADC 40, a CPU 42, a storage section 44, an internal RAM 46, and an interface 48.

The ADC 40 is an analog/digital converter that converts the analog data (voltage value/current value), that is inputted from the analog front end IC 12, into digital data, and output the digital data to the CPU 42. Note that the analog front end IC 12 may be provided with an analog/digital converter corresponding to the ADC 40, and analog data may be converted into digital data within the analog front end IC 12, and the converted digital data may be outputted to the 8-bit MCU 14.

The CPU 42 executes digital calculation process in accordance with programs stored in the storage section 44. The storage section 44 is a non-volatile storage section that stores various types of programs that are used in processing at the CPU 42, such as a battery residual amount computing program that is used in the present exemplary embodiment and the like, and set values, and the like. Further, in the present exemplary embodiment, the CPU 42 stores various types of reference data that are used in computing the battery residual amount Note that the CPU 42 is not particularly limited provided that if is a non-volatile storage section, and may be, for example, a Flash ROM or the like.

Figure 2:
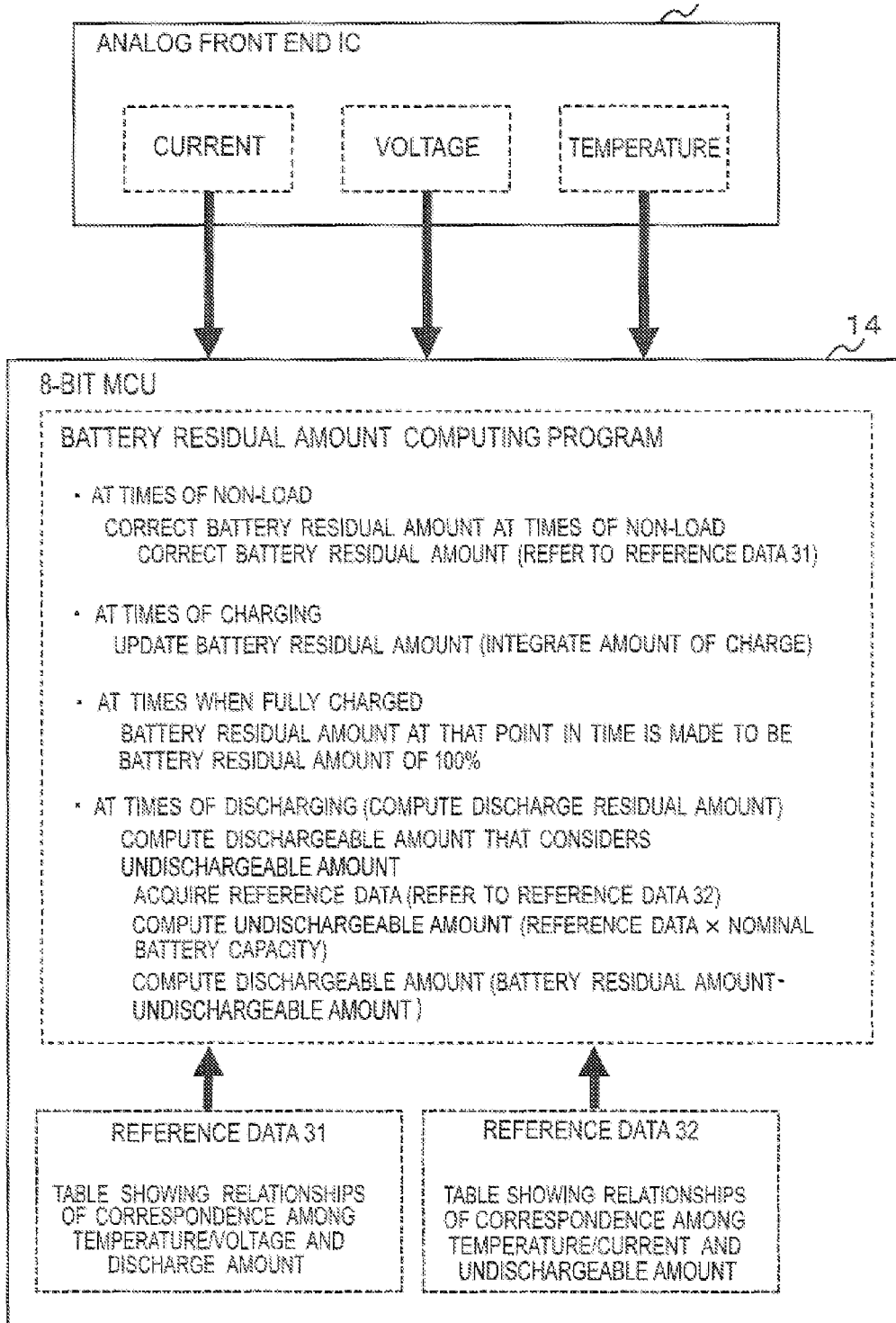
FIG. 2 is an explanatory drawing showing the specifications of a battery residual amount measurement program and summaries of reference data of the present exemplary embodiment.

The basic specifications of the battery residual amount computing program and summaries of the reference data are shown in FIG. 2, and details thereof are described later. Note that the present exemplary embodiment is structured such that the battery residual amount computing program and the reference data are stored in advance in the storage section 44. However, the present invention is not limited thereto, and may be structured such, that the battery residual amount computing program and the reference data are installed in the storage section 44 from a storage medium or an external device (not shown) or the like in which they are stored.

Further, the internal RAM 46 ensures a region for work at times when the battery residual amount computing program and the like are executed at the CPU 42, and stores data that is temporarily used at the times of executing programs.

The interface 48 carries out communication with a PC 8, and is for inputting data (in the present exemplary embodiment, a nominal battery capacity, details of which are described later), that is inputted from the PC 8, to the 8-bit MCU 14. As a concrete example, a serial interface is used in the present exemplary embodiment.

The thermometer 16 is a meter for measuring the ambient temperature of the battery cell group 1, and is structured by a thermistor or the like for example. The measured value (analog temperature data) that is measured at the thermometer 16 is inputted via the ADC 40 to the CPU 42. The storage section 18 is a non-volatile storage section that stores various types of data such as the nominal battery capacity and the like. Note that the storage section 18 is not particularly limited provided that it is a non-volatile storage section, and, for example, an EEPROM or the like is used therefor.

The charger 2 charges the voltages of the respective battery cells of the battery cell group 1, and further, discharges the voltages of the respective battery cells of the battery cell group 1. For example, a power source, a power generating device, and the like are examples of the charger 2 of the present exemplary embodiment. Further, a motor or the like is an example of the load 4. Both utilize general technologies and are not particularly limited, and therefore, description thereof is omitted here. Note that, in the present exemplary embodiment, the charger 2 and the load 4 are not always connected to the battery cell group 1 (the battery residual amount measurement system 10), and are connected thereto as needed.

The battery residual amount measurement operation of the battery cell group 1 of the battery residual amount measurement system 10 of the present exemplary embodiment is described next.

First, at the battery residual amount measurement system 10 of the present exemplary embodiment, in the initialization processing of a program such as at the time when the power source is turned on or the like, nominal battery capacity storage processing, that inputs nominal battery capacity (xAh) of the battery cells of the battery cell group 1 and stores the nominal battery capacity (xAh) in the storage section 18, is carried out. A flowchart that is an example of the flow of this nominal battery capacity storage processing is shown in FIG. 3.

In step 100, a user inputs the nominal battery capacity of the battery cell group 1 from the console of the PC 8 via the interface 48 to the battery residual amount measurement system 10. In next step 102, the inputted nominal battery capacity is stored in the storage section 18, and thereafter, the present processing ends. Due to this nominal battery capacity storage processing, there becomes a state in which the nominal battery capacity of the battery cell group 1, that is the object of measurement of the battery residual amount measurement system 10 at the present time, is stored in the storage section 18.

Figure 3:
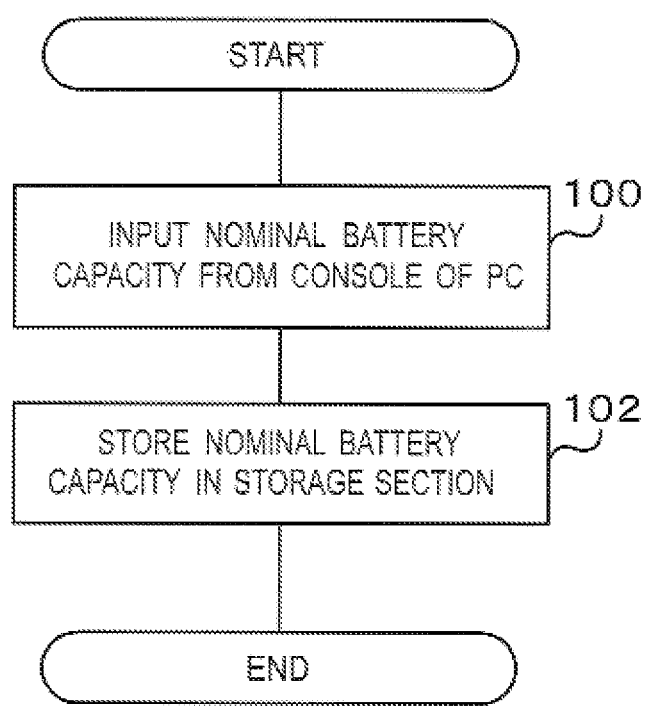
FIG. 3 is a flowchart showing the flow of nominal battery capacity storage processing in the battery residual amount measurement system of the present exemplary embodiment.

Thereafter, in cases in which the battery cell group 1 that is the object of measurement is changed to the battery cell group 1 that has a different nominal battery capacity, by carrying out the nominal battery capacity storage processing shown in FIG. 3 in the same way, the nominal battery capacity of the battery cell group 1 that is the object of measurement is stored in the storage section 18.

Figure 4:
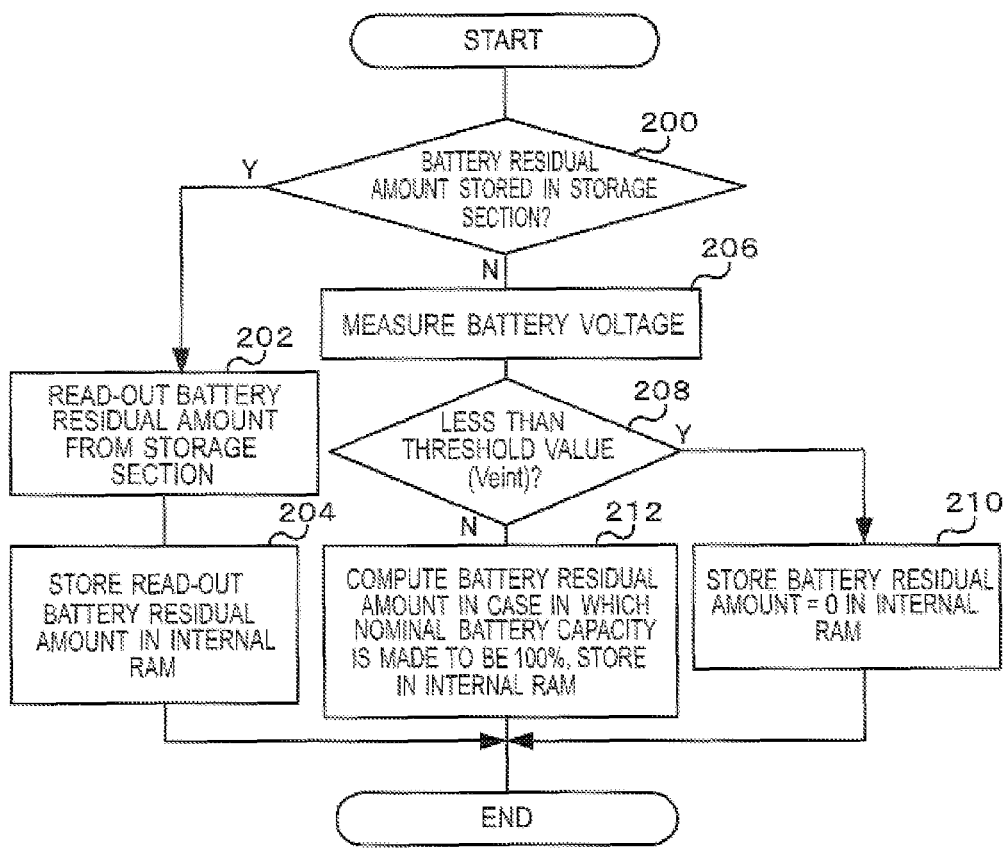
FIG. 4 is a flowchart showing the flow of battery residual amount storage processing in the battery residual amount measurement system of the present exemplary embodiment.

Further, battery residual amount storage processing, that stores the battery residual amount of the battery cell group 1 in the internal RAM 46 of the 8-bit MCU 14, is carried out. A flowchart of an example of the flow of this battery residual amount storage processing is shown in FIG. 4.

First, in step 200, it is determined whether or not the battery residual amount of the battery cell group 1 that is the object of measurement is stored in the storage section 18. If the battery residual amount is stored, the process moves on to step 202 where the battery residual amount is read-out from the storage section 18. In next step 204, the read-out battery residual amount is stored in the internal RAM 46, and thereafter, the present process ends.

On the other hand, in a case in which the battery cell group 1 is connected for the first time to the battery residual amount measurement system 10, or a case in which the battery cell group 1 that is the object of measurement is changed, or the like, mere is a state in which the battery residual amount of that battery cell group 1 that is the object of measurement is not stored in the storage section 18, and therefore, the process moves on to step 206.

In step 206, the voltages of all of the battery cells of the battery cell group 1 are measured at the voltage measurement circuit 22. In next step 208, it is determined whether or not the measured voltage values are less than a threshold value Veint (threshold data that is stored in advance in the storage section 18 in order to determine the absence/presence of a battery residual amount). When a measured value (a battery voltage value) that is less than the threshold value Veint exists, the process move on to step 210. In step 210, the battery residual amount is set to battery residual amount=0 (no battery residual amount), and the battery residual amount is stored in the storage section 18. Thereafter, the present processing ends.

On the other hand, when the measured values (battery voltages) of all of the battery cells are greater than or equal to the threshold value Veint, the battery residual amount, that corresponds to the nominal battery capacity in a case in which the nominal battery capacity is made to be 100%, is computed, and is stored in the storage section 18. Thereafter, the present process ends. Due to this battery residual amount storage processing, there becomes a state in which the battery residual amount of the present time of the battery cell group 1, that is the object of measurement of the battery residual amount measurement system 10 at the present time, is stored in the internal RAM 46 of the 8-bit MCU 14.

(Battery Residual Amount Computing Processing)

Battery residual amount computing processing is carried out at the CPU 42 of the 8-bit MCU 14 of the battery residual amount measurement system 10 of the present exemplary embodiment, in a state in which the nominal battery capacity of the battery cell group 1 that is the object of measurement is stored in the storage section 18 due to the above-described nominal battery capacity storage processing, and the battery residual amount of the present time of the battery cell group 1 that is the object of measurement is stored in the internal RAM 46. In the present exemplary embodiment, concretely, the battery residual amount computing processing is executed due to a battery residual amount computing program, that is stored in the storage section 44, being executed.

Note that, in the present exemplary embodiment, before this battery residual amount computing processing is carried out, reference data (reference data 31 and reference data 32) are stored in advance in the storage section 44 of the 8-bit MCU 14. The reference data are described here.

Figure 5:
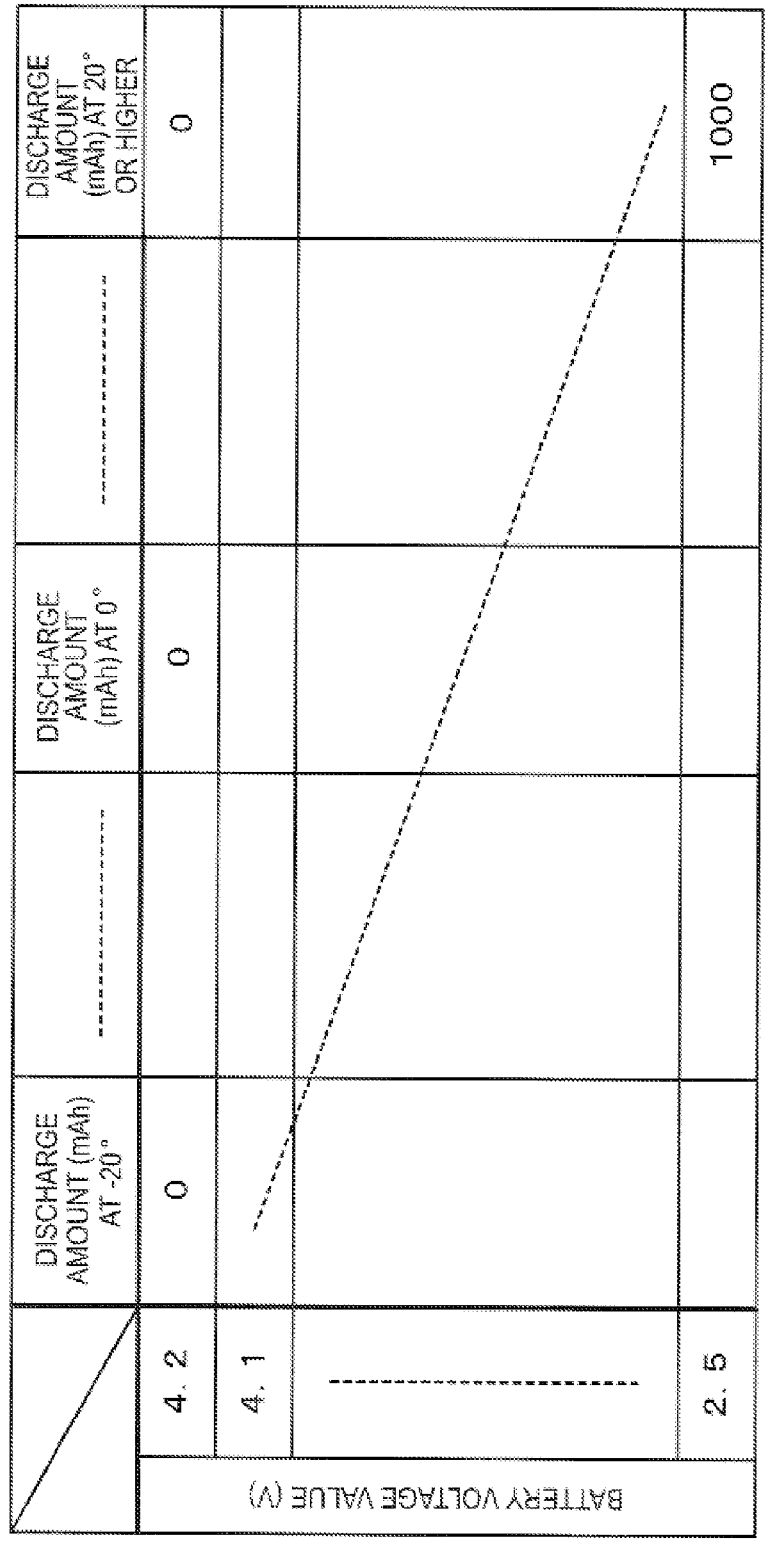
FIG. 5 is an explanatory drawing showing a table (reference data) that is used in the battery residual amount measurement system of the present exemplary embodiment and that shows relationships of correspondence among temperature, battery voltage, and discharge amount at a nominal battery capacity that is a reference.

The battery residual amount measurement system 10 of the present exemplary embodiment uses the reference data 31 and the reference data 32 as two types of reference data. The reference data 31 is a table that shows the relationships of correspondence among temperature (the ambient temperature of the battery cell group 1), battery voltage, and discharge amount at a nominal battery capacity that is the reference of the battery cell group 1. The reference data 33 is used for computing the battery residual amount in processing at times of non-load (to be described in detail later). An example of the reference data 31 (table) is shown in FIG. 5. Note that in the present exemplary embodiment, as an example, the relationships of correspondence among temperature and voltage and discharge amount of the battery cell group 1 (lithium ion battery) whose nominal battery capacity is 2000 mAh, are acquired in advance, and the acquired data are converted into data of a case in which the nominal battery capacity is 1000 mAh, and this converted data is made into the form of a table, and this table is used as the reference data 31. Namely, in the present exemplary embodiment, a nominal battery capacity of 1000 mAh is used as the reference nominal battery capacity, and the reference data 31 of the battery cell group 1 (a lithium ion battery) at the reference nominal battery capacity is stored in advance in the storage section 44.

Figure 6:
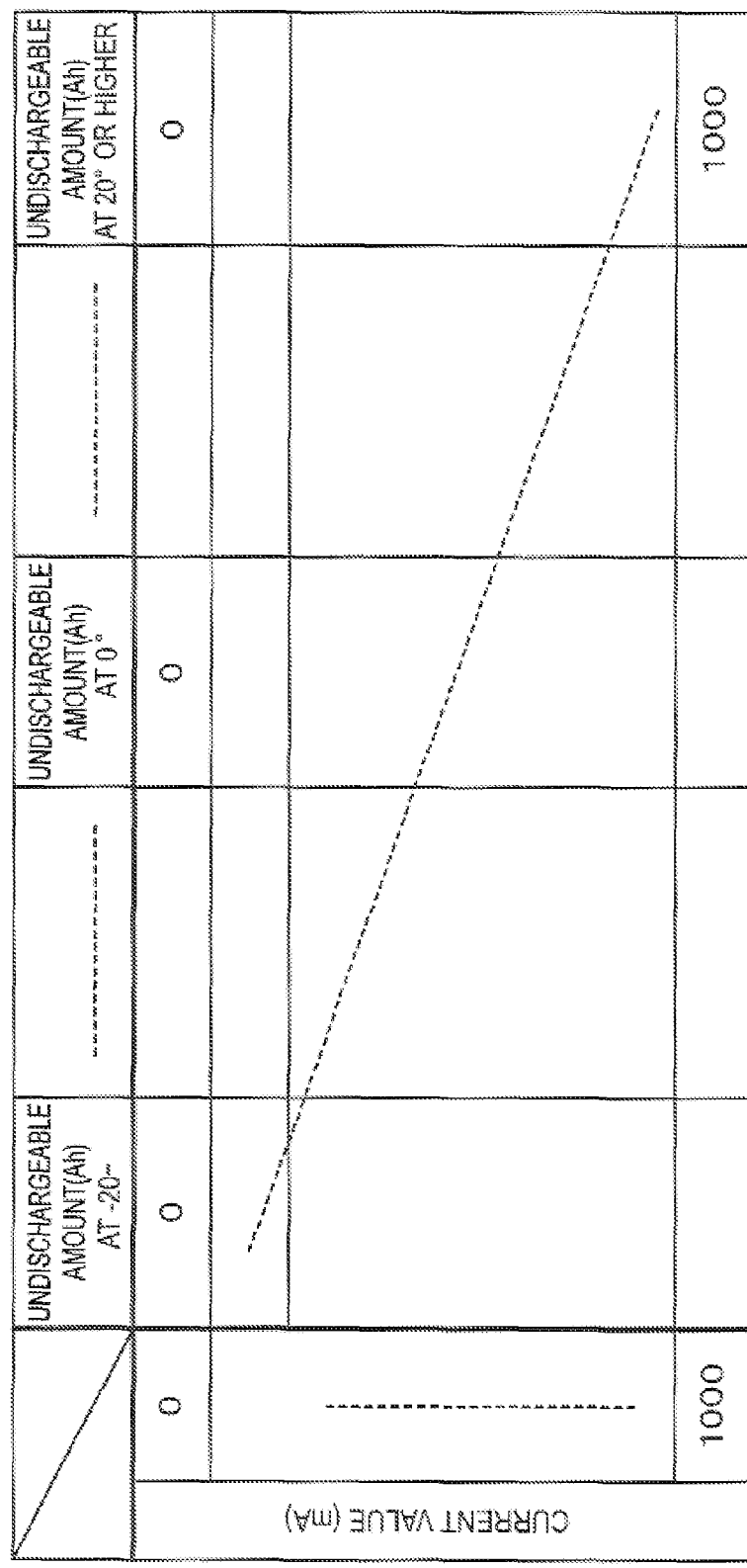
FIG. 6 is an explanatory drawing showing a table (reference data) that is used in the battery residual amount measurement system of the present exemplary embodiment, and that shows relationships of correspondence among temperature, current, and undischargeable amount, with the upper limit of the current being 1000 mA and the upper limit of the undischargeable amount being 1000 mAh, at a nominal battery capacity of 2000 mAh.

On the other hand, the reference data 32 is a fable that shows the relationships of correspondence among the temperature (ambient temperature of the battery cell group 1), current, and undischargeable amount, and is used in order to compute the battery residual amount in processing at times of discharging (to be described in detail later). An example of the reference data 32 (table) is shown in FIG. 6. Note that generally, the amount of electricity that is stored in a battery is not all discharged, and there exists an amount of electricity that cannot be discharged, in accordance with discharging conditions such as temperature, current, and the like. In the present exemplary embodiment, this amount of electricity that cannot be discharged is called the undischargeable amount.

Note that, in the present exemplary embodiment, as a concrete example, the relationships of correspondence among temperature and current and undischargeable amount of the battery cell group 1 (lithium ion battery), whose nominal battery capacity is 2000 mAh, are acquired in advance, and, among the acquired data, data up to an upper limit of current of 1000 mA and an upper limit of the undischargeable amount of 1000 mAh are made into the form of a table, and are stored in advance in the storage section 44 and utilized as the reference data 32.

Figure 7:
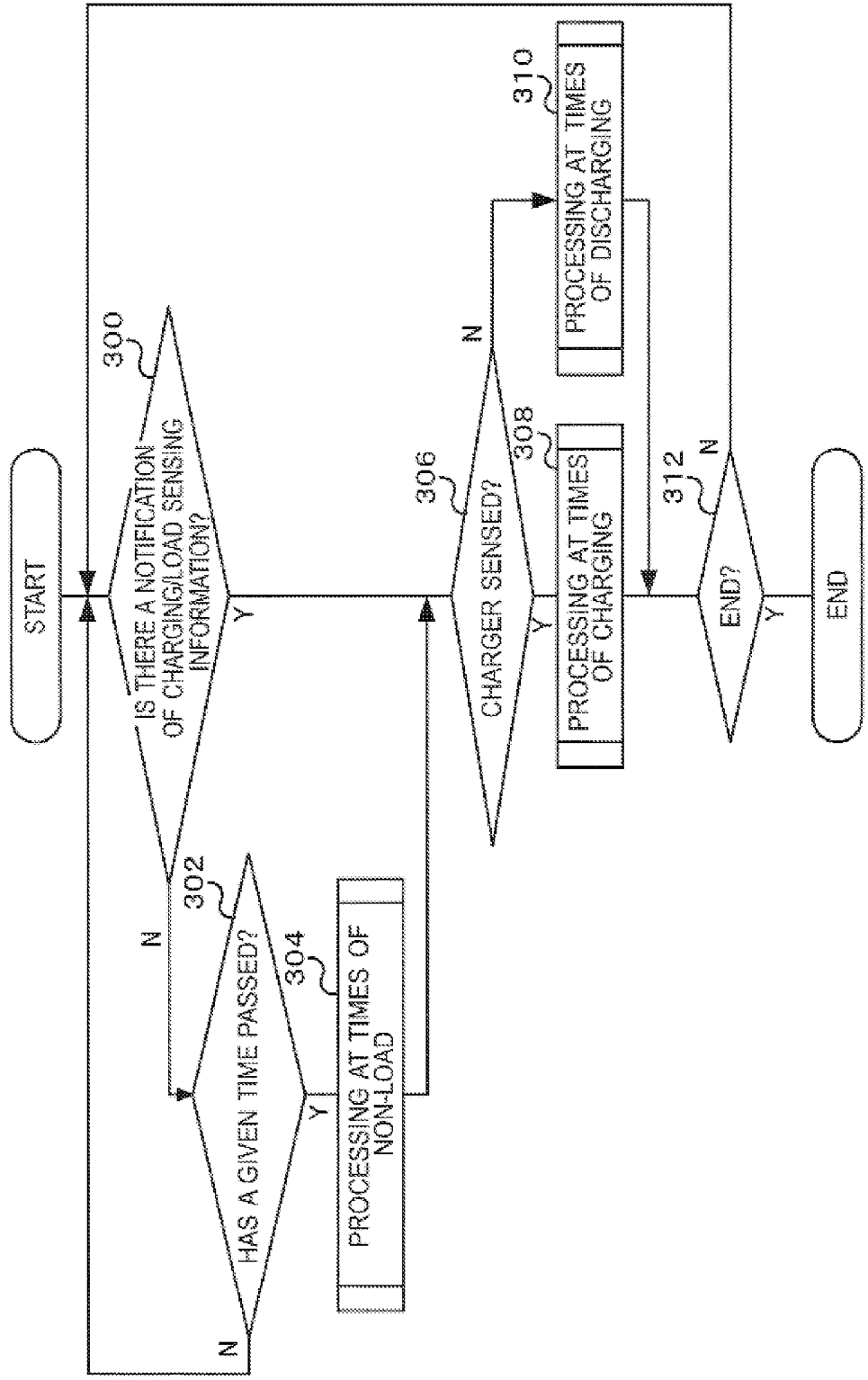
FIG. 7 is a flowchart showing the flow of the overall battery residual amount computing processing in the battery residual amount measurement system of the present exemplary embodiment.

The flow of the battery residual amount computing processing at the battery residual amount measurement system 10 of the present exemplary embodiment is described in detail next. A flowchart of an example of the flow of the overall battery residual amount computing processing of the present exemplary embodiment is shown in FIG. 7.

In step 300, it is determined whether or not notification of information, that expresses that it has been sensed that the charger 2 or the load 4 is connected to the battery cell group 1, has been received from the charger/load detection section 26. If notification has been received (if the charger 2 or the load 4 is connected), the process moves on to step 306. On the other hand, if notification has not been received, the process moves on to step 302 where it is determined, by a timer or the like (not illustrated), whether or not a given time (in the present exemplary embodiment, one hour as a concrete example) has passed. If the given time has not passed, the process returns to step 300. On the other hand, if the given time has passed, i.e., if neither the charger 2 not the load 4 has been connected to the battery cell group 1 in the given time or more, the process moves on to step 304 where processing at times of non-load (details of which are described later) is carried out. Thereafter, the process moves on to step 306. Note that, in the present exemplary embodiment, a state in which neither the charger 2 nor the load 4 is connected to the battery cell group 1 is called "non-load". As a concrete example of this non-load state, for example, there is the state in which the engine of the vehicle has been turned off in a case in which the battery residual amount measurement system 10 is an in-vehicle system. On for example, there is a state in which the power source of a personal computer has been turned off in a case in which the battery residual amount measurement system 10 is used in the personal computer.

In step 306, it is determined whether or not connection of the charger 2 has been sensed. If the charger 2 is connected to the battery cell group 1 (if communication of sensing of the charger 2 has been received), there is determined to be the occurrence of a charging operation, and the process moves on to step 308. In step 308, processing at times of charging (details to be described later) is carried out, and the battery residual amount is computed and stored in the internal RAM 46. Thereafter, the process moves on to step 312. On the other hand, if the load 4 is connected to the battery cell group 1 (if communication of sensing of the load 4 has been received), there is determined to be the occurrence of a discharging operation, and the process moves on to step 310. In step 310, processing at times of discharging (details to be described later) is carried out, and the battery residual amount is computed and stored in the internal RAM 46. Thereafter, the process moves on to step 312.

In step 312, it is determined whether or not to end the battery residual amount computing processing. If the processing is not to be ended, the process returns to step 300, and the present processing is repeated. On the other hand, if the processing is to be ended, the present processing is ended.

Next, details of the processing at times of non-load of step 304, the processing at times of charging of step 308, and the processing at times of discharging of step 310 are respectively described.

(Processing at Times of Non-Load)

Figure 8:
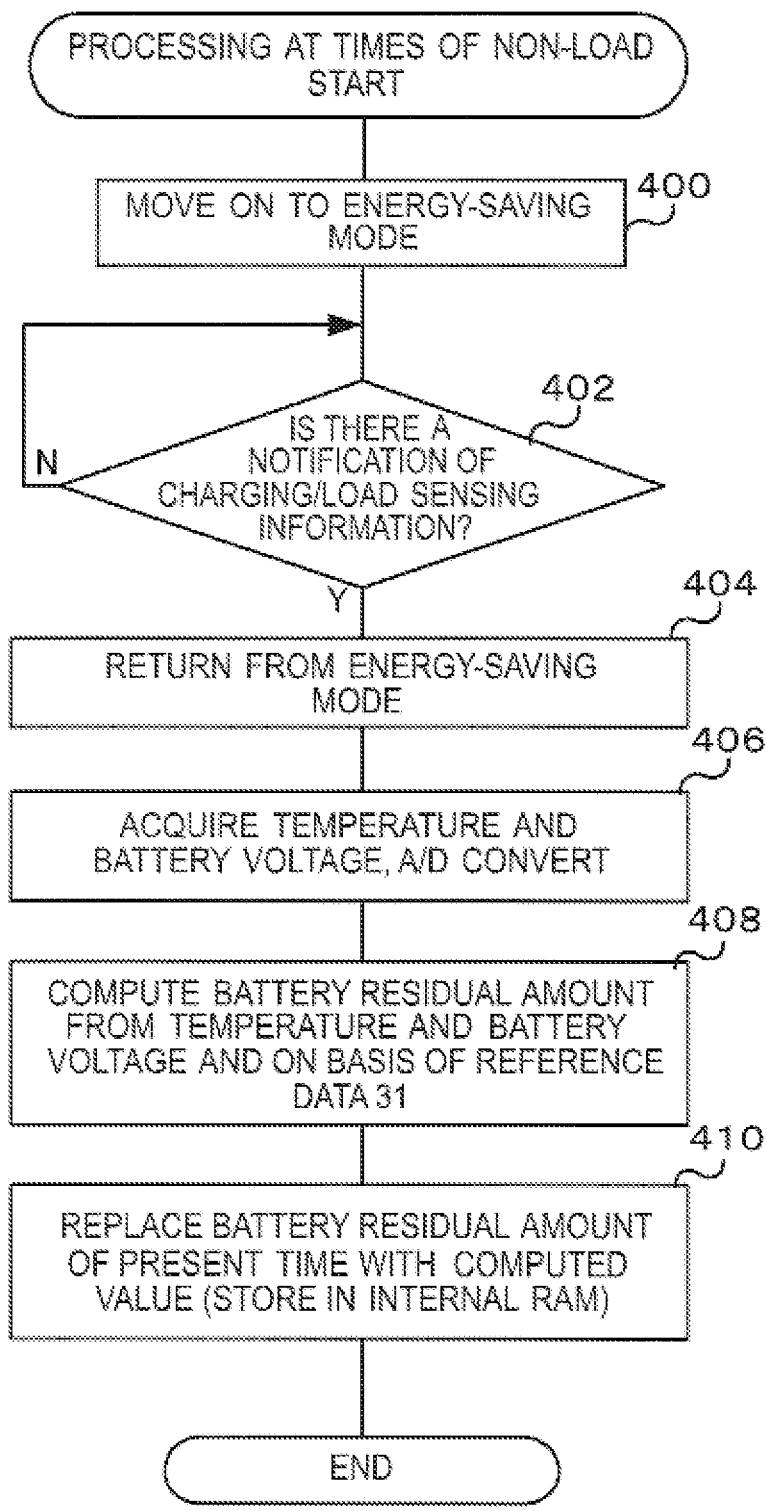
FIG. 8 is a flowchart showing the flow of processing at a time of non-load in the battery residual amount measurement system of the present exemplary embodiment.

First, the processing at times of non-load is described. A flowchart of an example of the flow of the processing at times of non-load of the present exemplary embodiment is shown in FIG. 8.

In step 400, because the non-load state is continuing for a given time, the battery residual amount measurement system 10 moves to an energy-saving mode. The energy-saving mode is a mode for curbing the electric power that is consumed at the battery residual amount measurement system 10, and is a state in which, for example, the CPU 42 is stopped and the various peripherals and the like also are stopped.

In next step 402, it is determined whether or not notification of information, that expresses that it has been sensed that the charger 2 or the load 4 is connected to the battery cell group 1, has been received from the charger/load detection section 26. If notification has not been received, there becomes a standby state, and the energy-saving mode is continued. On the other hand, if notification has been received, the process moves on to step 404. In step 404, the battery residual amount measurement system 10 is returned from the energy-saving mode.

In next step 406, the temperature at the present time is acquired from, the thermometer 16, and the battery voltage at the present point in time is acquired from the voltage measurement circuit 22, and these values are respectively converted from analog to digital data. In next step 408, the battery residual amount is computed by taking the discharge amount into consideration, on the basis of the reference data 31 and from the acquired temperature and battery voltage. Note that, at this time, the reference data 31 that is stored in the storage section 44 is reference data of a nominal battery capacity of 1000 mAh, and therefore, there is the need to convert to the nominal battery capacity of the battery cell group 1 that is the object of measurement at the present time. To this end, the battery residual amount is computed by multiplying a gain constant (the nominal battery capacity of the battery cell group 1 at the present time/1000 mAh) that is proportional to the nominal battery capacity of the battery cell group 1 at the present time (that is stored in the storage section 18), by a reference value of the reference data 31. Then, after the battery residual amount that is currently stored in the internal RAM 46 is replaced with the computed battery residual amount, the present processing ends.

In this way, in the present exemplary embodiment, in accordance with this processing at times of non-load, in a case in which a non-load state continues for a given time, the battery residual amount measurement system 10 moves to the energy-saving mode, and, when the battery residual amount measurement system 10 returns from the energy-saving mode, the battery residual amount of the battery cell group 1, at the point in time of the return from the energy-saving mode, is computed by taking the discharge amount into consideration and in accordance with the battery voltage and the ambient temperature of the battery cell group 1 at the point in time of the return, and the battery residual amount is stored in the internal RAM 46. Accordingly, there may be a state in which the battery residual amount at the point in time of the return from the energy-saving mode is measured accurately and is stored in the internal RAM 46.

(Processing at Times of Charging)

Figure 9:
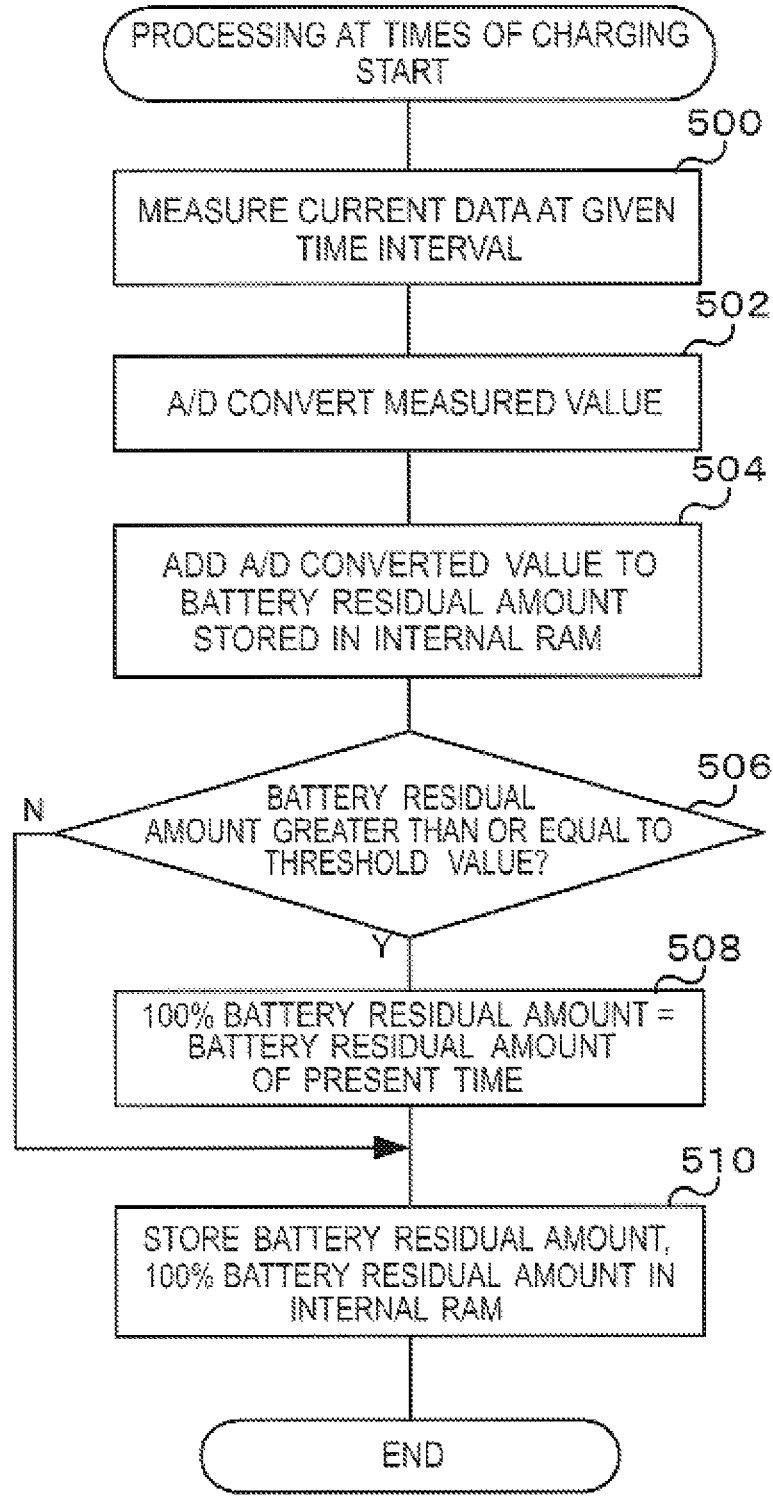
FIG. 9 is a flowchart showing the flow of processing at a time of charging in the battery residual amount measurement system of the present exemplary embodiment.

Processing at times of charging is described next. A flowchart of an example of the flow of processing at times of charging of the present exemplary embodiment is shown in FIG. 9.

Because a charging operation is occurring, in step 500, current data, that is measured by the current measurement circuit 24 of the analog front end IC 12, is acquired at a given time interval (in the present exemplary embodiment, for example 10 ms). In next step 502, the acquired current data (measured value) is A/D converted into digital data at the ADC 40. In subsequent step 504, the A/D converted digital data is added to (integrated with) the battery residual amount that is stored in the internal RAM 46. Namely, the amount of charge is added to (integrated with) the battery residual amount.

In next step 506, the battery voltage at the present point in time is acquired from the voltage measurement circuit 22, and is A/D converted into digital data, and, as a condition of overcharging, it is determined whether or not the value thereof is greater than or equal to a predetermined threshold value. If the value is less than the threshold value, the process moves on to step 510. On the other hand, if the value is greater than or equal to the threshold value, the process moves on to step 508 where, because there is an overcharged state, the battery residual amount of the present point in time is made to be the amount of electricity (i.e., the battery capacity) of 100% of the nominal battery capacity. Moreover, in step 510, the battery residual amount is stored in the internal RAM 46, and thereafter, the present processing ends.

In this way, in the present exemplary embodiment, in accordance with this processing at times of charging, the battery residual amount is computed by adding (integrating) the amount of charge, and the battery residual amount is stored in the internal RAM 46. Further, when, as a condition of overcharging, the battery voltage at the present point in time is greater than or equal to a predetermined threshold value, it is determined that there is an overcharged state, and the battery residual amount is computed as the nominal battery capacity (battery capacity) of 100%. Accordingly, there may be a state in which the battery residual amount is measured accurately and is stored in the internal RAM 46.

(Processing at Times of Discharging)

Figure 10:
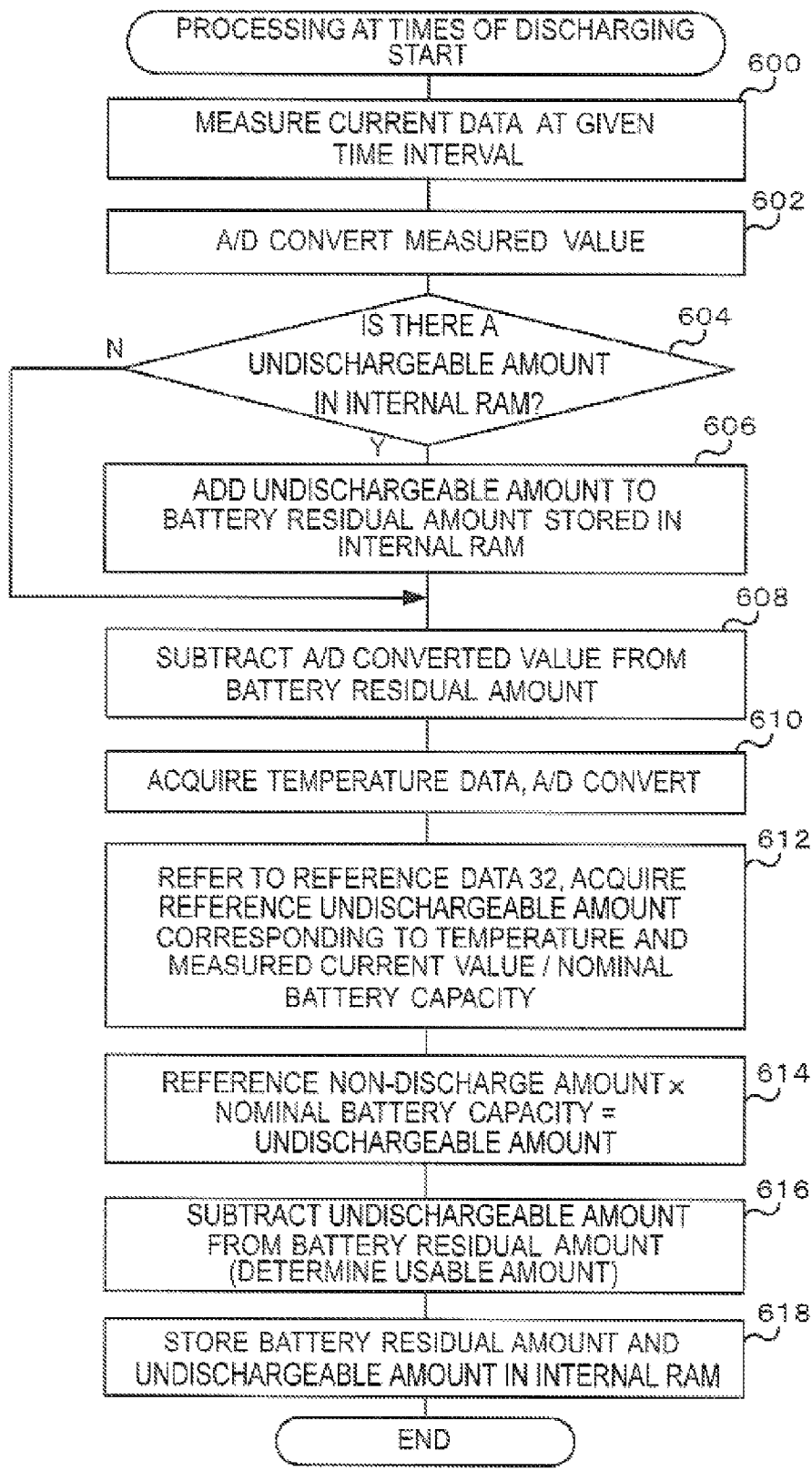
FIG. 10 is a flowchart showing the flow of processing at a time of discharging in the battery residual amount measurement system of the present exemplary embodiment.

Processing at times of discharging is described next. In the present exemplary embodiment, in the case of processing at times of discharging, by subtracting, from battery residual amount, the undischargeable amount that is the amount of electricity that exists in accordance with the discharging condition and cannot be discharged, the amount of electricity that may actually be used at the present point in time (the usable amount) is computed as the battery residual amount and is stored. A flowchart of an example of the flow of processing at times of discharging in the present exemplary embodiment is shown in FIG. 10.

Because a discharging operation is occurring, in step 600, current data, that is measured by the current measurement circuit 24 of the analog front end IC 12, is acquired at a given time interval (in the present exemplary embodiment, for example, 10 ms). In next step 602, the acquired current data (measured value) is A/D converted into digital data at the ADC 40.

In subsequent step 604, it is determined whether or not the undischargeable amount is stored in the internal RAM 46. If the undischargeable amount is not stored, the process moves on to step 608. On the other hand, if the undischargeable amount is stored, the process moves on to step 606 where the stored undischargeable amount is added to the battery residual amount that is stored in the internal RAM 46. In the present exemplary embodiment, in cases in which a discharging operation has occurred and the processing at times of discharging has been carried out before, the undischargeable amount was computed in the processing at times of discharging of the previous time, and is already stored in the internal RAM 46. On the other hand, the battery residual amount that is stored in the internal RAM 46 is the usable amount, and is an amount of electricity that is computed by subtracting the undischargeable amount from the battery residual amount of the battery cell group 1 (the amount of electricity that actually remains in the battery cell group 1). Therefore, by adding the undischargeable amount to the battery residual amount in accordance with the processing of step 606, the actual amount of electricity that remains in the battery cell group 1 at the time of the start of the present discharging operation is computed.

In next step 608, the measured value that has been A/D converted is subtracted from the battery residual amount. Namely, the discharge amount is subtracted from the actual battery residual amount at the time of the start of the discharging operation.

In subsequent step 610, temperature data is acquired from the thermometer 16, and the acquired temperature data (analog data) is A/D converted by the ADC 40 and made into digital data.

In next step 612, the reference data 32 stored in the storage section 44 is referred to, and a us dischargeable amount (a reference undischargeable amount) that is a reference value is acquired on the basis of the temperature and a normalized current value that is obtained by normalizing the measured current value of the present time by the nominal battery capacity (stored in the storage section 18) of the battery cell group 1 that is the object of measurement at the present lime. Concretely, the normalized current value is computed by dividing the measured current value of the present time by the nominal battery capacity of the battery cell group 1 that is the object of measurement at the present time (measured current value/nominal battery capacity).

In next step 614, the undischargeable amount is computed by multiplying the nominal battery capacity of the battery cell group 1, that is the object of measurement of the present time, by the reference undischargeable amount (reference undischargeable amount×nominal battery capacity). Due thereto, an undischargeable amount that corresponds to the discharging condition at the tune of the present discharging operation can be computed. Note that the method of computing the undischargeable amount is not limited thereto, and the undischargeable amount may be computed by multiplying a proportional multiplier, that corresponds to the nominal battery capacity, by the reference undischargeable amount.

Further, in next step 616, an usable amount is computed by further subtracting the computed undischargeable amount from the battery residual amount. In subsequent step 618, the computed undischargeable amount and the battery residual amount (here, the usable amount) are stored in the internal RAM 46, and thereafter, the present processing ends.

In this way, in the present exemplary embodiment, in this processing at times of discharging, a normalized current value, that is obtained by dividing the current value measured at the time of the present discharging by the nominal battery capacity of the battery cell group 1 that is the object of measurement, and a reference undischargeable amount, that corresponds to the temperature data measured at the time of the present discharging, are acquired from the reference data 32. The undischargeable amount is computed by multiplying the nominal battery capacity of the battery cell group 1 that is the object of measurement by the reference undischargeable amount. Further, the measured current value and the computed undischargeable amount are subtracted from the battery residual amount that is stored in the internal RAM 46, and the usable amount is computed and made to be the battery residual amount. In this way, an undischargeable amount that corresponds to the discharging condition at the time of the present discharging can be computed, and therefore, the undischargeable amount may be computed accurately even in cases in which the discharging condition (the temperature) changes. Accordingly, the battery residual amount may be measured accurately.

In the process of arriving at the present invention, the present inventors firstly studied how to devise a reduction in costs of system preparation by avoiding the need to separately manufacture battery residual amount measurement systems, by measuring the battery residual amounts of batteries having different characteristics by a same battery residual amount measurement system and by taking even the undischargeable amount into consideration. Then, the present inventors studied storing, in a memory and expressly individually (per differing characteristic), first, the undischargeable amounts of batteries for which installation (measurement) was supposed or decided upon in advance, and utilizing these undischargeable amounts. However, in this case, it was supposed that there was the need to store, in a memory and per nominal battery capacity such as per nominal battery capacity of 1000 mAh, 1500 mAh, 2000 mAh or the like, data expressing undischargeable amounts or data expressing the relationships of correspondence between temperatures and undischargeable amounts for example, and that there was the need to store plural data.

Due to the studies of the present inventors based on the above, it became possible to realize avoiding the need to separately manufacture battery residual amount measurement systems. However, the present, inventors found that, firstly, because there is the need to increase the memory in accordance with batteries for which installation is supposed or decided upon, there may be supposed the new problem of the memory capacity becoming huge and the per-unit surface area, cost and the like of the battery residual amount measurement system increasing. Secondly, the present inventors found that there may be supposed the problem that it is only possible to handle characteristics (nominal battery capacities) of batteries for which installation has been decided upon, and that battery residual amounts cannot be measured accurately in cases in which batteries having characteristics (nominal battery capacities) that cannot be imagined are used. Therefore, the present inventors obtained the results of study that it is not preferable to store the undischargeable amounts of batteries for which installation (measurement) has been decided upon, in a memory and expressly individually (per differing characteristic), and use the on dischargeable amounts.

In contrast, the present inventors newly discovered by experimentation that the undischargeable amount may be defined as proportional to the nominal battery capacity. Therefore, the present inventors arrived at the feature of the present invention, such as that of the battery amount measurement system 10 of the present exemplary embodiment, that even in a case in which the nominal battery capacity of the battery that is the object of measurement is changed to a different nominal battery capacity, it is possible to compute an appropriate undischargeable amount that corresponds to the battery cell group 1 after the change by acquiring a normalized current value and a reference discharge amount that corresponds to temperature data, and multiplying the nominal battery capacity (the nominal battery capacity of the battery cell group 1 after the change) by that reference discharge amount.

As described above, in accordance with the present invention, there is no need to store data per nominal battery capacity. Therefore, battery residual amounts of batteries (battery cell groups 1) that have different characteristics may be measured accurately at the same battery residual amount measurement system 10, without increasing the memory capacity.

Further, regardless of the characteristic (the nominal battery capacity) of the battery cell group 1, the battery residual amount may be measured accurately even for a battery cell group 1 that, for example, the designers or users of the battery residual amount measurement system 10 had not envisaged.

Note that, in the above-described exemplary embodiment, as the input section that inputs to the battery residual amount measurement system 10 in the nominal battery capacity storage processing that is executed in the initialization processing of the program (at the time when the power source is turned on), the nominal battery capacity is inputted to the battery residual amount measurement system 10 from the console of the PC 8 via the interface 48. However, the present invention is not limited thereto. Concrete examples of the battery residual amount measurement system 10 that is equipped with another input section are shown in schematic structural drawings in FIG. 11 and FIG. 12.

Figure 11:
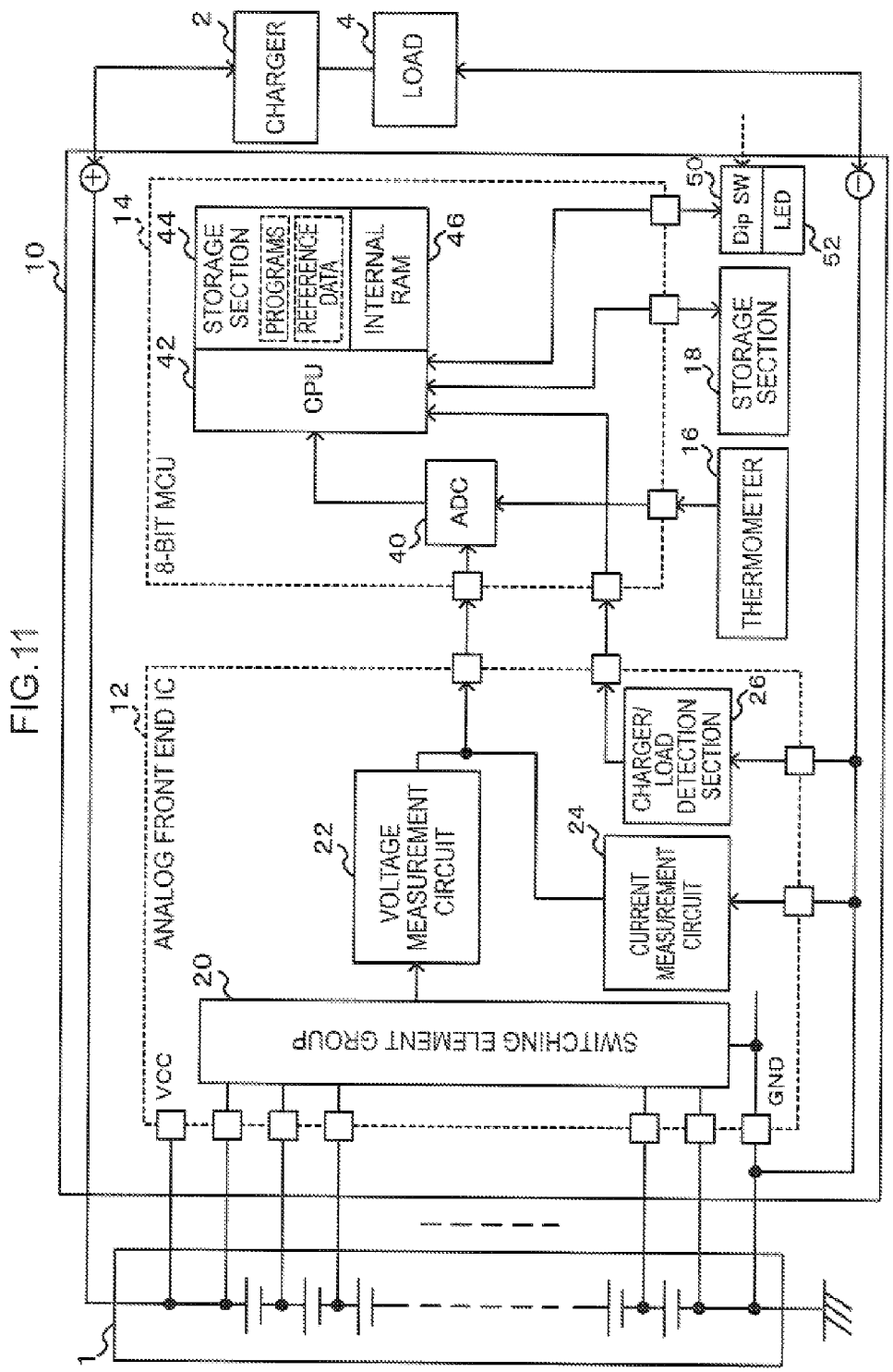
FIG. 11 is a schematic structural drawing showing another example of the battery residual amount measurement system of the present exemplary embodiment.

The battery residual amount measurement system 10 shown in FIG. 11 has, instead of the interface 48 of the above-described battery residual amount measurement system 10 shown in FIG. 1, a dip switch (Dip SW) portion 50 that functions as an input section, and an LED 52 that functions as a display section. Note that, in the nominal battery capacity storage processing at the battery residual amount measurement system 10 shown in FIG. 11, it suffices to change step 100 of the nominal battery capacity storage processing shown in above-described FIG. 3, such that the nominal battery capacity is inputted from the dip switch portion 50. Further, in the battery residual amount measurement system 10 shown in FIG. 11, the nominal battery capacity (the number itself), that is inputted from the display switch portion 50, is displayed on the LED 52. In this way, in the battery residual amount measurement system 10 shown in FIG. 11, the nominal battery capacity may be inputted from the dip switch portion 50. Therefore, the effect is obtained that processing may be executed on only the substrate (board) of the battery residual amount measurement system 10, and there is no need to connect an external device (the PC 8) such as at the battery residual amount measurement system 10 shown in FIG. 1. Further, by providing the LED 52, the effect is obtained that the designer or the user or the like may confirm the nominal battery capacity that is stored in the storage section 18. Note that the input section is not limited to a dip switch, and similar effects may be obtained even by another input section provided that it is a switch from which rectangular waves are outputted (a switch that can pulse-input to the 8-bit MCU 14), or the like.

Figure 12:
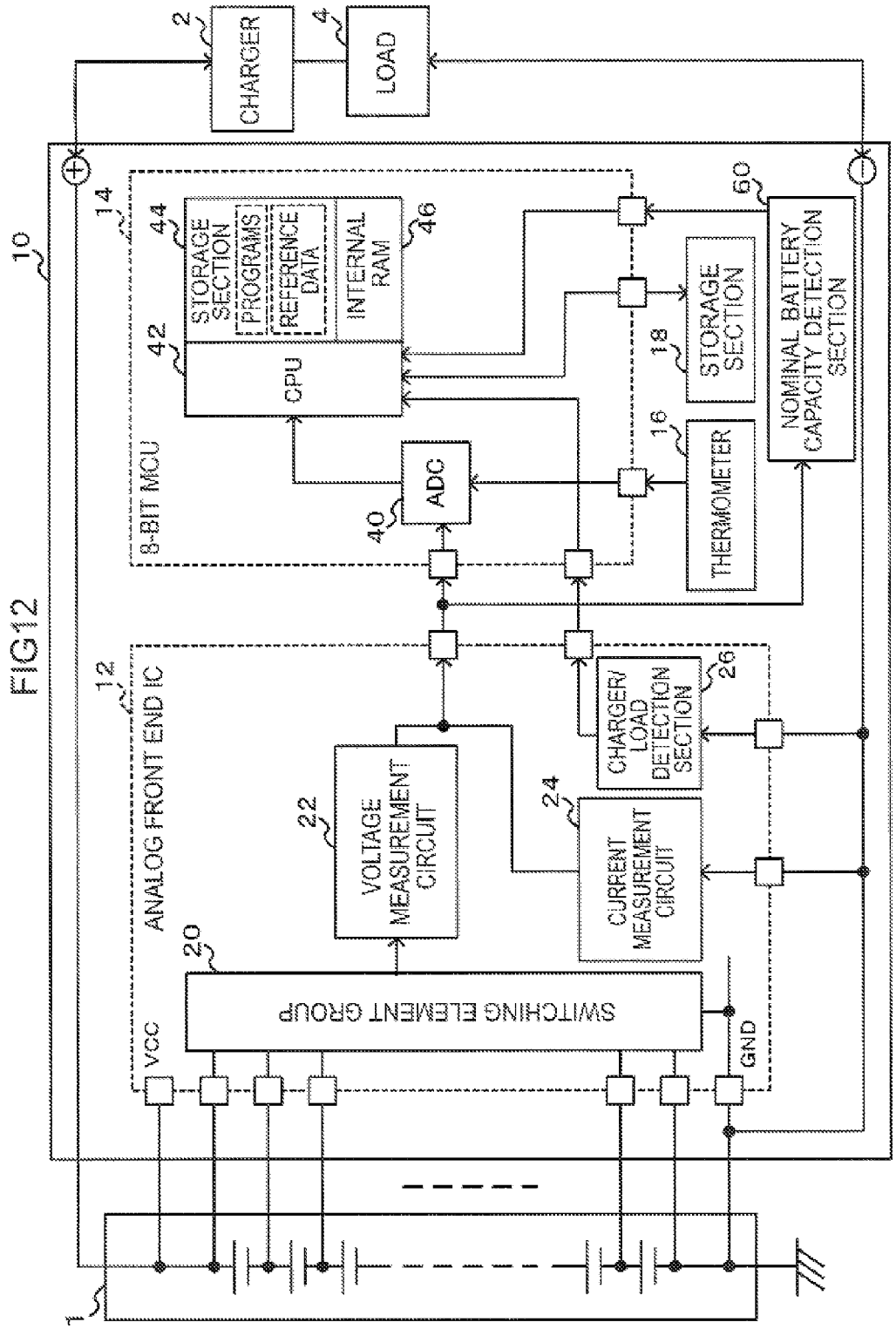
FIG. 12 is a schematic structural drawing showing another example of the battery residual amount measurement system of the present exemplary embodiment.

Further, the battery residual amount measurement system 10 shown in FIG. 12 has, instead of the interface 48 of the above-described battery residual amount measurement system 10 shown in FIG. 1, a nominal battery capacity detection section 60 that functions as an input section. The nominal battery capacity detection section 60 has the function of detecting the nominal battery capacity on the basis of the battery voltage of the battery cell group 1 measured at the analog front end IC 12. It suffices to use an existing method, such as the technique disclosed in JP-A No. 10-144358 for example, or the like, as the method of detecting the nominal battery capacity. Note that, in the nominal battery capacity storage processing at the battery residual amount measurement system 10 shown in FIG. 12, it suffices to change step 100 of the nominal battery capacity storage processing shown in above-described FIG. 3, such that the nominal battery capacity detection section 60 automatically detects the nominal battery capacity. In this way, in the battery residual amount measurement system 10 shown in FIG. 12, the nominal battery capacity of the battery cell group 1 may be detected automatically by the nominal battery capacity detection section 60, and therefore, labor of the designer or the user or the like may be eliminated.

As described above, in the battery residual amount measurement system 10 of the present exemplary embodiment, the nominal battery capacity of the battery cell group 1 that is the object of measurement is stored in the storage section 18, and the battery residual amount is stored in the internal RAM 46, and the battery residual amount computing program is executed, and the battery residual amount computing processing is carried out. Further, in the battery residual amount measurement system 10, the reference data 31 (a table), that shows the relationships of correspondence among temperature, voltage, and discharge amount, of the battery cell group 1 whose reference nominal battery capacity is 1000 mAh, is stored in the storage section 44. The battery residual amount is computed by multiplying a gain constant that is proportional to the nominal battery capacity of the battery cell group 1 that is the object of measurement (the nominal battery capacity of the battery cell group 1 that is the object of measurement/1000 mAh), by reference data, of the reference data 31.

Still further, the reference data 32, that expresses the relationships of correspondence among temperature, current and undischargeable amount, with the upper limit of current being 1000 mA and the upper limit of the undischargeable amount being 1000 mAh, at the battery cell group 1 whose nominal battery capacity is 2000 mAh, is stored in the storage section 44. By referring, to the reference data 32, a reference undischargeable amount is acquired from the temperature and a normalized current value (measured value of the current at the present time/nominal battery capacity). The product of the reference undischargeable amount×the nominal battery capacity is made to be the undischargeable amount, and the battery residual amount of the battery cell group 1 is computed.

By computing the battery residual amount in this way, in the present exemplary embodiment, the battery residual amounts of battery cell groups 1 having different nominal battery capacities may be measured accurately.

Note that, in the above-described exemplary embodiment, the reference data 31 is made to be data at the time when the reference nominal battery capacity is 1000 mAh. However, the reference nominal battery capacity is not limited to 1000 mAh, and may be another nominal battery capacity. Further, the reference data 32 is made to be data, up to an upper limit of current of 1000 mA and an upper limit of undischargeable amount of 1000 mAh, among data of the relationships of correspondence among the temperature, current and undischargeable amount at the battery cell group 1 whose nominal battery capacity is 2000 mAh. However, the reference data 32 is not limited to the above, and may be the relationships of correspondence at the battery cell group 1 of another nominal battery capacity, or may be values at which the upper limits of current and undischargeable amount also are different from those described above. It suffices to determine these in accordance with the characteristics, specifications and the like of the battery cell group 1 and the battery residual amount measurement system 10. Further, in the present exemplary embodiment, the reference data 31 and the reference data 32 are those for a lithium ion battery, but the present invention is not limited thereto. When the battery residual amount measurement system 10 may be used for another battery. It suffices to store the reference data 31 and the reference data 32 that correspond to the battery that is the object of measurement.

Further, in the above-described exemplary embodiment, the object of measurement of the battery residual amount measurement system 10 is made to be the battery cell group 1 that is a secondary battery that is a lithium ion battery. However, the present invention is not limited thereto, and the battery that is the object of measurement is not particularly limited.

Moreover, in the above-described exemplary embodiment, in the nominal battery capacity storage processing that is executed in the initialization processing of the program (at the time when the power source is turned on), the nominal battery capacity of the battery cell group 1 is stored in the storage section 18. However, the present invention is not limited thereto. Similar effects are obtained even if the nominal battery capacity of the battery cell group 1 is stored in the storage section 44 for example. By storing the nominal battery capacity of the battery cell group 1 in the storage section 44 of the 8-bit MCU 14 in this way, externally-mounted parts may be eliminated, and therefore, a decrease in costs is anticipated.

Further, the structures of the battery residual amount measurement system 10, the analog front end IC 12, the 8-bit MCU 14 and the like, and the battery residual amount computing processing and the like, that were described in the above exemplary embodiment, are examples, and may, of course, be changed in accordance with the situation within a scope that does not deviate from the gist of the present invention.

What is claimed is:

1. A battery residual amount measurement device comprising:
   a first storage section that stores reference undischargeable amounts that correspond to ambient temperatures of a battery and current values of current discharged from the battery;
   a second storage section that stores a battery residual amount;
   a current detection section that detects a current value of current discharged from a measurement object battery and that outputs the current value of the current discharged from the measurement object battery; and
   a calculating section, to which the current value of the current discharged from the measurement object battery output from the current detection section is input, and that acquires, from the first storage section, the reference undischargeable amount that corresponds to an ambient temperature of the measurement object battery and the current value of the current discharged from the measurement object battery input from the current detection section, and outputs a present battery residual amount to the second storage section that corresponds to the acquired reference undischargeable amount and a nominal battery capacity of the measurement object battery.

2. The battery residual amount measurement system device of claim 1,
   wherein the calculating section computes a usable amount by subtracting an amount of electricity lost due to discharging and an undischargeable amount that corresponds to the acquired reference undischargeable amount and the nominal battery capacity of the measurement object battery from an initial battery residual amount stored in the second storage section, and stores the calculated usable amount as the present battery residual amount in the second storage section.

3. The battery residual amount measurement device of claim 2, further comprising a third storage section that stores an initial undischargeable amount,
   wherein, when the initial undischargeable amount is already stored in the third storage section, the calculating section adds the stored initial undischargeable amount to the battery residual amount stored in the second storage section, and thereafter, computes a usable amount by subtracting an amount of electricity that was lost due to discharging and the undischargeable amount from the added battery residual amount, and makes the usable amount be the present battery residual amount.

4. The battery residual amount measurement device of claim 2, wherein the calculating section calculates the undischargeable amount, by multiplying the reference undischargeable amount, by a proportional gain constant that corresponds to the nominal battery capacity of the measurement object battery and to a battery residual amount when the reference undischargeable amount was determined in advance.

5. The battery residual amount measurement device of claim 1, further comprising a voltage detection section that detects a voltage value of the measurement object battery,
   wherein the first storage section stores reference discharge amounts that are determined in advance in accordance with ambient temperatures of the battery and voltage values of the battery, and, in a case of a non-load state in which neither a charging operation nor a discharging operation is being carried out at the measurement object battery, the calculating section acquires, from the first storage section, a reference discharge amount that corresponds to an ambient temperature of the measurement object battery and the voltage value detected at the voltage detection section, and outputs the battery residual amount to the second storage section that corresponds to the acquired reference discharge amount and the nominal battery capacity of the measurement object battery.

6. The battery residual amount measurement device of claim 5, wherein, in a case of the non-load state, the calculating section calculates the battery residual amount by multiplying, by the reference discharge amount, a proportional gain constant that corresponds to the nominal battery capacity of the measurement object battery and to a battery residual amount at a time when the reference discharge amount was determined in advance.

7. The battery residual amount measurement device of claim 1, further comprising an input section that inputs the nominal battery capacity of the battery.

8. The battery residual amount measurement device of claim 7, wherein the input section is a nominal battery capacity detection section that detects a voltage value of the battery, and, on the basis of the detected voltage value, detects the nominal battery capacity.

9. The battery residual amount measurement device of claim 7, further comprising a display section that displays the nominal battery capacity of the battery that is inputted from the input section.

10. The battery residual amount measurement device of claim 1, wherein the battery has a plurality of battery cells that are connected in series, and
the battery residual amount measurement system further comprises an equalizing section that makes voltages of the battery cells equal.

11. A non-transitory computer readable medium storing a battery residual amount measurement program for causing a computer to function as the calculating section of the battery residual amount measurement device of claim 1.

12. A battery residual amount measurement method comprising:
in a state in which reference undischargeable amounts, that have been determined in advance in accordance with ambient temperatures of a battery and current values of current discharged from the battery, are stored in a first storage section,
detecting, by a current detection section, a current value of current discharged from a measurement object battery; and
when a discharging operation is carried out at the battery, acquiring, by a calculating section, the reference undischargeable amount that corresponds to an ambient temperature of the measurement object battery and the current value of current discharged from the measurement object battery detected by the current detection section from the first storage section, and outputting, by the calculating section, a battery residual amount on the basis of a undischargeable amount corresponding to the acquired reference undischargeable amount and a nominal battery capacity of the battery.

\* \* \* \* \*